United States Patent
Juliano et al.

(10) Patent No.: US 6,898,060 B2
(45) Date of Patent: May 24, 2005

(54) GATED DIODE OVERVOLTAGE PROTECTION

(75) Inventors: Patrick A. Juliano, Shrewsbury, MA (US); Warren R. Anderson, Westborough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/445,617

(22) Filed: May 27, 2003

(65) Prior Publication Data

US 2004/0240127 A1 Dec. 2, 2004

(51) Int. Cl.[7] .................................... H02H 9/00
(52) U.S. Cl. ........................................ 361/56
(58) Field of Search ................. 257/199, 200, 257/288, 335, 347, 355, 360; 361/56, 91.1, 91.5, 111

(56) References Cited

U.S. PATENT DOCUMENTS

| | | | | |
|---|---|---|---|---|
| 4,989,057 A | * | 1/1991 | Lu | ............................. 257/357 |
| 6,226,409 B1 | * | 5/2001 | Cham et al. | ................. 382/228 |
| 6,314,204 B1 | * | 11/2001 | Cham et al. | ................. 382/228 |
| 6,380,570 B1 | * | 4/2002 | Voldman | ..................... 257/355 |
| 6,762,918 B2 | * | 7/2004 | Voldman | ..................... 361/91.1 |

* cited by examiner

*Primary Examiner*—Ronald Leja

(57) ABSTRACT

Disclosed herein is a gated diode overvoltage protection circuit. In one embodiment, the circuit includes: a terminal, a gated diode, and a bias circuit. The terminal is configured to convey a voltage signal. The gated diode has an anode, a cathode, and a gate. The gated diode is coupled between the terminal and a predetermined voltage node so as to enter a forward conduction mode during electrostatic discharge (ESD) events, overvoltage conditions, or transient signal excursions. The bias circuit is configured to establish a low-resistance path between the cathode and gate when the gated diode is in a forward conduction mode, and to eliminate the low-resistance path when the gated diode is not in the forward conduction mode.

21 Claims, 5 Drawing Sheets

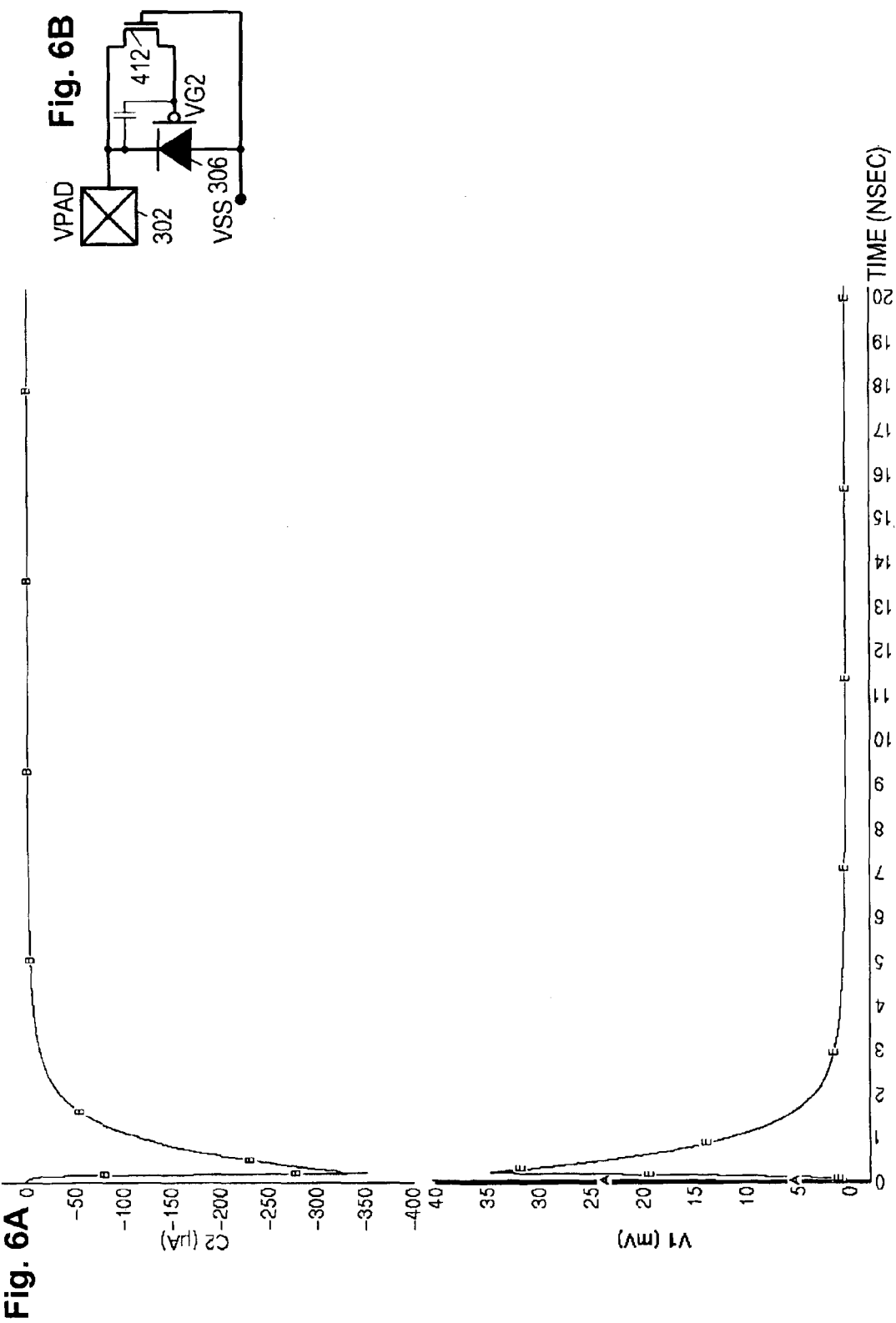

GATED DIODE OVERVOLTAGE PROTECTION

BACKGROUND

In semiconductor processing, SOI (semiconductor-on-insulator) technology is becoming increasingly important since it permits the formation of high-speed integrated circuits. In SOI technology, a relatively thin layer of semiconducting material, e.g., Si, overlays a layer of insulating material (e.g., a buried oxide region). This relatively thin layer of semiconducting material is generally the area wherein active devices are formed in SOI devices. Devices formed on SOI offer many advantages over their bulk Si counterparts; including higher performance, absence of latch-up, higher packing density and low voltage applications.

Despite the advantages obtained using SOI technology, SOI circuits, like other electronic devices, are susceptible to damage from electrostatic discharge (ESD). ESD is a transient surge in voltage (negative or positive) that may induce a large current in the circuit. To protect circuits against damage from ESD, protection schemes attempt to provide a discharge path with a low voltage turn-on and a high current capacity (the ability to generate or sink a large amount of current before a large amount of negative or positive voltage is developed). Discharge paths using traditional bulk devices (such as diodes) do not work well on SOI devices because of the presence of a relatively thin SOI buried oxide layer. That is, conventional diodes on SOI devices have small current capacity because the current is carried laterally through an active device region of limited thickness.

One approach for protecting SOI circuitry from ESD is found in U.S. Pat. No. 4,989,057 to Lu. Lu discloses a SOI diode, which could be used for ESD design. The SOI diode disclosed in Lu consists of a floating-body SOI transistor, with the gate connected to a signal pad. However, the Lu diode itself may have a thin insulating layer that is susceptible to damage from relatively moderate voltage differences. To provide diode operation, Lu shorts the gate to the cathode. Nevertheless, the Lu diode may not be suitable for usage in a mixed-voltage environment because the voltage difference between the gate and the anode may be sufficient to damage the insulating layer. This damage may lead to early ESD failures. This problem is not limited to SOI devices. Rather, it exists in bulk Si devices as well.

SUMMARY

Accordingly, there is disclosed herein a gated diode overvoltage protection circuit. In one embodiment, the circuit includes: a terminal, a gated diode, and a bias circuit. The terminal is configured to convey a voltage signal. The gated diode has an anode, a cathode, and a gate. The gated diode is coupled between the terminal and a predetermined voltage node so as to enter a forward conduction mode during electrostatic discharge (ESD) events, overvoltage conditions, or transient signal excursions. The bias circuit is configured to establish a low-resistance path between the cathode and gate when the gated diode is in a forward conduction mode, and to eliminate the low-resistance path when the gated diode is not in the forward conduction mode.

Also disclosed is an electrostatic discharge protection method. In one embodiment, the method comprises: (a) configuring one or more gated diodes to shunt ESD events and minimize any signal excursion outside a predetermined voltage range; and (b) protecting gate insulators of the one or more gated diodes. The protecting includes (1) minimizing a voltage difference between the cathode and gate of each gated diode that is operating in a forward conduction mode; and (2) increasing the voltage difference between the cathode and gate of each gated diode that is not operating in the forward conduction mode to provide a gate voltage between the positive and negative supply voltages.

BRIEF DESCRIPTION OF THE DRAWINGS

A better understanding of exemplary embodiment of the present invention can be obtained when the following detailed description of various embodiments is considered in conjunction with the following drawings, in which:

FIG. 6a shows voltage and current curves associated with simulations of ESD operation;

FIG. 6b shows a circuit used for simulating the ESD operation shown in FIG. 6a;

Figure 1:
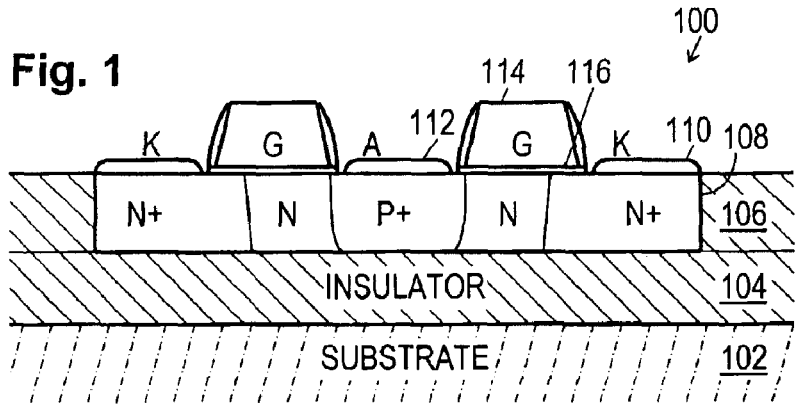
FIG. 1 shows an illustrative cross-section of a gated diode.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

As a starting point, consider FIG. 1, which shows a cross-sectional view of a gated SOI (semiconductor-on-insulator) diode 100. This figure is for explanatory purposes and may not necessarily be an accurate depiction of an actual device. As with other SOI devices, diode 100 is manufactured on the surface of a substrate 102. Substrate 102 may be a portion of a silicon wafer because silicon is an inexpensive, well-understood material that offers various beneficial properties including a relatively high thermal conductivity. However, other substrate materials are known and may be used.

The characteristic feature of SOI technology is the creation of semiconductor devices on an insulating surface. Traditionally, the substrate itself is not an insulator due to the poor thermal conductivity of most insulating materials. Accordingly, an insulating layer 104 may be created on substrate 102. Traditionally, the insulating layer is silicon dioxide (SiO$_2$), but again, other insulating materials are known and may be used.

Diode 100 may be an isolated region of semiconducting material 108 that is deposited on insulation layer 104 and that is laterally isolated within a second insulating layer 106. The electrical isolation of region 108 may advantageously allow diode 100 to operate faster, to be smaller, and to be placed more closely to other devices. Semiconducting material 108 includes at least three subregions that are tailored to form the active device region of diode 100. The subregions are labeled P+, N, and N+ to indicate the doping of the material (i.e., the type and amount of impurities introduced into the semiconducting material). An overhead view of the device might indicate that diode 100 is either "U-shaped" or rectangular in nature, so that the two N+ regions may actually be a single N+-type region that surrounds an inner N-type region, which in turn surrounds the inmost P+-type region.

The N+ region may be coupled to an electrical conductor 110, and the P+ region may be coupled to another electrical conductor 112. Conventional materials for these conductors may include aluminum, copper, silver, gold, tungsten, molybdenum, tantalum, titanium, and various suicides (e.g., WSi$_2$, MoSi$_2$, TaSi$_2$, TiSi$_2$). Of course, other conducting (and semiconducting) materials are known and may be used.

Diode 100 may also include a gate 114 that is isolated from the semiconducting material 108 and contacts 110, 112 by a thin insulator 116. Gate 114 may be a conventional conducting material, but for a number of reasons, polycrystalline silicon ("polysilicon") may be preferred. In addition to its well-understood nature, polysilicon may operate as a mask in a self-aligned deposition technique for creating diode 100. Between the gate 114 and the semiconducting material 108, the gate insulator 116 is thin. Certain limits may be enforced on the maximum voltage difference across the gate insulator to avoid significant degradation. For a standard goal of a 10-year lifetime, the steady-state difference for these gate thicknesses may be limited to less than 1.5 volts.

Diode 100 is thus a three-terminal device. The three terminals are labeled A (anode), K (cathode), and G (gate). A P-N junction exists between the P+ and N-type regions of material 108. Current can flow with relative ease from anode to cathode, but will under normal conditions be unable to flow from cathode to anode. A positive voltage difference between the anode and the gate will induce an inversion layer in the N-type region, thereby increasing the junction area and reducing the resistance to current flow from anode to cathode.

Diode 100 is only one example of a gated diode. Various other material configurations, in both SOI and bulk silicon technologies, may be used to implement a gated diode. Further, though the protection of a gate insulator in a gated diode is discussed in detail below, the described techniques may also be suitable for protecting insulation layers in other gated devices.

Figure 2A:
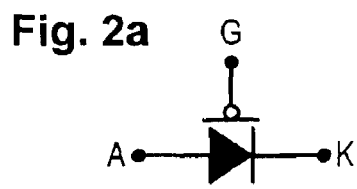
FIG. 2a shows a schematic symbol used to represent a gated diode.
Figure 2B:
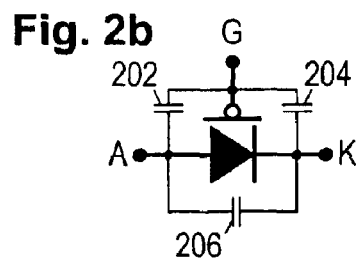
FIG. 2b shows parasitic capacitances that may be associated with a gated diode.

FIG. 2a shows a circuit schematic symbol used herein to represent a gated diode. The three terminals are labeled A (anode), K (cathode), and G (gate). FIG. 2b shows a gated diode along with parasitic capacitances that exist between the three terminals. Capacitance 202 represents the parasitic capacitance between the gate and the anode ($C_{GA}$), capacitance 204 represents the parasitic capacitance between the gate and the cathode ($C_{GK}$), and capacitance 206 represents the parasitic capacitance between the anode and the cathode ($C_{AK}$). The gate-anode capacitance 202 is expected to be relatively small and may be neglected for purposes of the present discussion. The gate-cathode capacitance 204 is expected to be dominated by capacitance across the gate insulator, which may be relatively substantial. The anode-cathode capacitance 206 is expected to be dominated by the inherent capacitance of the P-N junction. This capacitance can vary enormously based on device geometry, but is expected to be minimal, particularly in devices constructed using SOI techniques. In the subsequent figures, the parasitic gate-cathode capacitance 204 will be explicitly shown.

Figure 3:
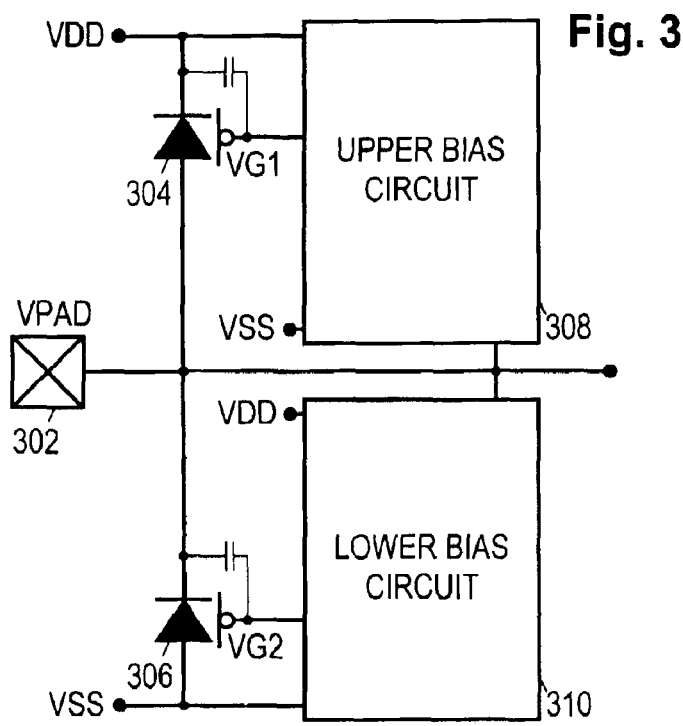
FIG. 3 shows an electrostatic discharge (ESD) protection circuit in accordance with a first embodiment.

FIG. 3 shows an integrated circuit pad 302 that may be used for connecting an integrated circuit to an external terminal, pin, solder ball, or other electrical connector suitable for transporting electrical signals to or from the integrated circuit. It may be desirable to protect circuitry (not shown) coupled to pad 302 from damage due to electrostatic discharge (ESD) events, overvoltage conditions, and/or transient signal excursions beyond a predetermined voltage range. Though these concerns are similar and indeed may involve significant overlap, to the extent that they can be distinguished, they may be characterized in the following ways. ESD events generally occur when the integrated circuit is unpowered. Transient signal excursions generally occur when the integrated circuit is powered. Overvoltage conditions involve somewhat more sustained application of a signal voltage outside a given voltage range (i.e., the time scale is greater than that generally encountered for ESD events and transient signal excursions), and are most commonly encountered as the integrated circuit is being powered up. Unless the context indicates otherwise, the circuits and methods described below may be used to provide protection in each of these circumstances, and accordingly, the labels "ESD event", "overvoltage condition", and "signal excursion" may be used interchangeably.

To protect against ESD events, overvoltage conditions, and/or transient signal excursions, two gated diodes may be provided. The anode of gated diode 304 is coupled to pad 302, and the cathode is coupled to a positive voltage rail (e.g., supply voltage VDD) or some other node having a predetermined voltage at the upper end of a predetermined voltage range when power is applied to the integrated circuit. The cathode of gated diode 306 is coupled to pad 302, and the anode is coupled to a negative voltage rail (e.g., ground, supply voltage VSS) or some other node having a predetermined voltage at the lower end of the predetermined voltage range when power is applied to the integrated circuit. For protection against ESD events, the power rails may provide a low resistance path with the maximum available current capacity for dissipating the event energy and minimizing the probability of damage. When the integrated circuit is powered, this diode configuration ideally operates to keep the pad signal voltage (VPAD) within the predetermined voltage range (e.g., between the voltage rails). That is, diode 304 ideally prevents VPAD from exceeding the upper end of the predetermined voltage range, and diode 306 ideally prevents VPAD from dropping below the lower end of the voltage range.

As previously mentioned, gated diodes 304, 306 may include a gate insulator that is susceptible to damage from even moderate voltage differences. Accordingly, FIG. 3 also shows an "upper" bias circuit 308 and a "lower" bias circuit 310 that operate to protect gated diodes 304 and 306, respectively. In various embodiments, the bias circuits provide two desirable features: a) a "short circuit" between the cathode and gate when the gated diode operates in a forward-conduction mode (i.e., current flows from anode to cathode); and b) a gate voltage that is between the voltages of the nodes defining the predetermined voltage range when the pad voltage is also in the range. In one specific set of embodiments, upper bias circuit 308 provides a short circuit between cathode and gate when diode 304 is in forward conduction mode, and a gate voltage approximately midway between the positive voltage rail and the lowest pad voltage expected during normal operations. In these specific embodiments, lower bias circuit 310 provides a short circuit between cathode and gate when diode 306 is in forward conduction mode, and a gate voltage approximately midway between the negative voltage rail and the highest pad voltage expected during normal operations.

The short circuit between gate and cathode during forward conduction may be desirable for two reasons. First, the resistance to current flow is minimized. Second, the parasitic gate-cathode capacitance is bypassed, which may alternatively be viewed as simply minimizing the voltage drop across the gate insulator.

The intermediate gate voltages described above may be desirable during normal operations to extend the operating range of gated devices. For example, a SOI gated diode that is limited to a maximum voltage drop of 1.5 volts across the gate insulator may nevertheless be used in a circuit where the expected pad voltage ranges between 0 and 1.8 volts. (Such a configuration may be used in a device having a RAMBUS™ interface, which specifies an active signal voltage swing between 1.0 and 1.8 volts.) In one contemplated RAMBUS device embodiment, the voltage rails VSS and VDD are 0 and 1.8 volts, respectively.

Figure 4:
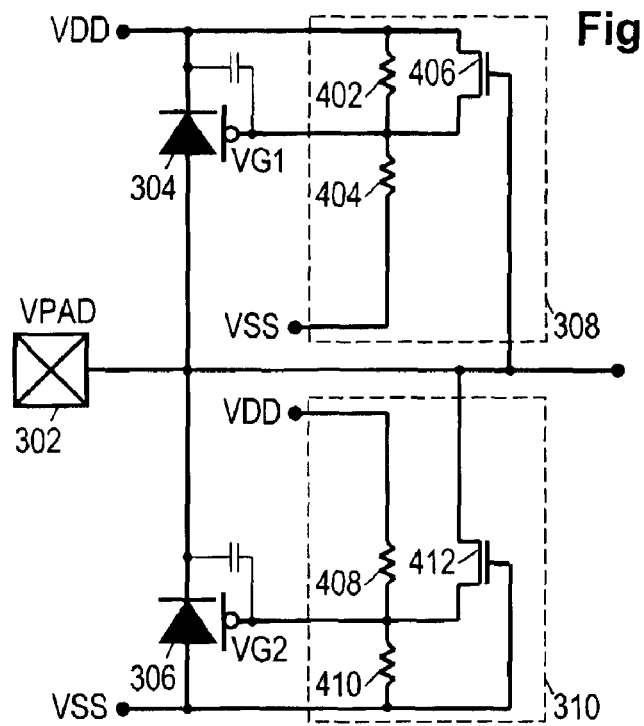
FIG. 4 shows an ESD protection circuit in accordance with a second embodiment.

FIG. 4 shows one embodiment of the upper and lower bias circuits 308, 310. Upper bias circuit 308 may include two resistances 402 and 404 coupled in series between the voltage rails VDD and VSS. This configuration is commonly known as a "voltage divider", and when power is applied, the circuit creates an intermediate voltage at the node (VG1) between the resistances by splitting the difference between the voltage rails in accordance with the ratio of the resistances. If it is desired to place VG1 at, say, 1.5 volts when the voltage difference between VDD and VSS is 1.8 volts, the resistances would be given a 3:15 ratio. The magnitude of the resistances may be large enough to reduce power consumption to tolerable levels, and may further be small enough to minimize their area requirements on the integrated circuit substrate.

Upper bias circuit 308 may further include a transistor 406 (which may be a metal-insulator-semiconductor field effect transistor, commonly called a MOSFET) coupled in parallel with resistance 402, and with its gate coupled to the pad voltage VPAD. When the circuit is unpowered, the gate voltage is zero. If a positive-going ESD event occurs, the rising pad voltage causes transistor 406 to enter a conducting, of "ON" state. When transistor 406 is on, its resistance is very low, in effect creating a "short circuit" between the gate and cathode of diode 304. When the circuit is powered, the voltage divider may operate as described above as long as transistor 406 is in the non-conducting, or "OFF" state. Transistor 406 may be off until the pad voltage approximately equals or exceeds the positive voltage rail VDD, at which point transistor 406 turns on, allowing current to bypass resistance 402. Again, the gate and cathode of diode 304 are in effect "short circuited" when transistor 406 is on.

Lower bias circuit 310 may also include two resistances 408 and 410 in a voltage divider configuration between the voltage rails to create an intermediate voltage for the gate (VG2) of diode 306 when power is applied. VG2 may be placed at the midpoint between the voltage rails using resistances with a 1:1 ratio. Lower bias circuit 310 may further include a transistor 412 (again, this may be a MOSFET) coupled between the gate VG2 of diode 306 and the pad VPAD, with the gate of transistor 412 coupled to the negative voltage rail VSS. When the circuit is unpowered, the gate voltage is zero. If a negative-going ESD event occurs, the falling pad voltage causes transistor 412 to turn on, thereby creating a short circuit between the gate and cathode of diode 306. When the circuit is powered, the voltage divider may operate normally as long as transistor 412 is off. Transistor 412 may be off until the pad voltage approximately equals or drops below the negative voltage rail VSS, at which point transistor 412 turns on. When transistor 412 is on, it may nullify the effect of the voltage divider and in effect "short circuit" the gate and cathode of diode 306.

Although the voltage dividers are described above as producing certain specific intermediate voltages between the voltage rails, there is a considerable amount of flexibility in choosing the intermediate voltages. The intermediate voltage during normal operations may be any voltage that satisfies the following conditions:

$$|V_{GA}| < V_{MAX} \text{ and } |V_{GK}| < V_{MAX},$$

where $V_{MAX}$ is the design limit for a voltage drop across the gate insulator, $V_{GA}$ is the gate-anode voltage, and $V_{GK}$ is the gate-cathode voltage. It should be further noted variation of the intermediate voltages may exist and may be tolerated when the above conditions are satisfied. The intermediate voltages produced by the voltage dividers may be subject to variation from competing effects such as parasitic capacitances and/or partial turn-on of the transistors.

Figure 5:
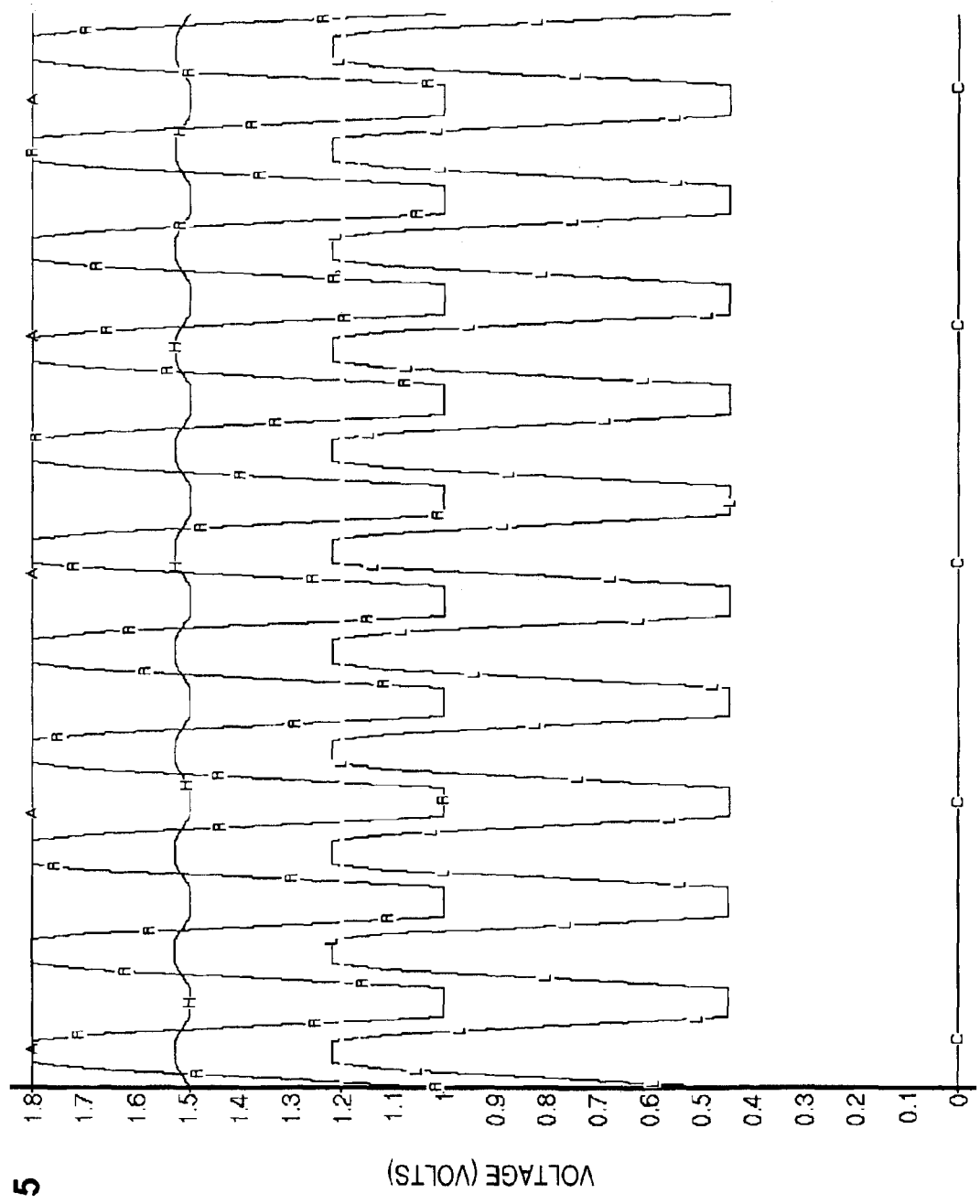
FIG. 5 shows voltage curves associated with simulations of normal operations for the second embodiment.

FIG. 5 shows a set of waveforms that result from simulated operation of the embodiment of FIG. 4 under normal operating conditions. Waveform "A" is the positive voltage rail (constant at 1.8 volts); waveform "C" is the negative voltage rail (constant at 0 volts); and waveform "R" shows an input voltage applied to the pad (VPAD). The input voltage as shown alternates between 1.0 and 1.8 volts, with nonzero rise and fall times. Waveform "H" is the gate voltage VG1, which holds relatively steady at 1.5 volts but shows roughly 0.1 volts of variation which may be due to small parasitic capacitances in diode 304 and transistor 406. Waveform "L" is the gate voltage VG2 which averages about 0.85 volts and shows about 0.35 volts of variation in each direction. This variation is in phase with the pad voltage, and may be due to the gate-cathode capacitance of diode 306. Although the use of smaller resistances in lower circuit 310 might significantly reduce this variation, the voltage drops across the gate insulator are well within limits, and the smaller resistances would undesirably increase the impedance loading on the input signal.

FIG. 6A shows two waveforms that result from simulated operation of the embodiment of FIG. 4 under ESD conditions (more specifically, an HBM discharge applied to VSS with the pad grounded). Note that ESD events may occur when the circuit is unpowered, so that for this simulation, the embodiment of FIG. 4 may be simplified and represented as shown in FIG. 6B. Waveform "B" is the current flowing through transistor 412 during the first 20 nanosecond after a negative-going electrostatic impulse is applied to the pad (VPAD), and waveform "E" is the gate voltage VG2 for diode 306 during this time. Note that the gate-cathode capacitance is quickly discharged as the gate is shorted to the cathode, and the voltage drop across the gate insulator is maintained well within the limits.

Figure 7:
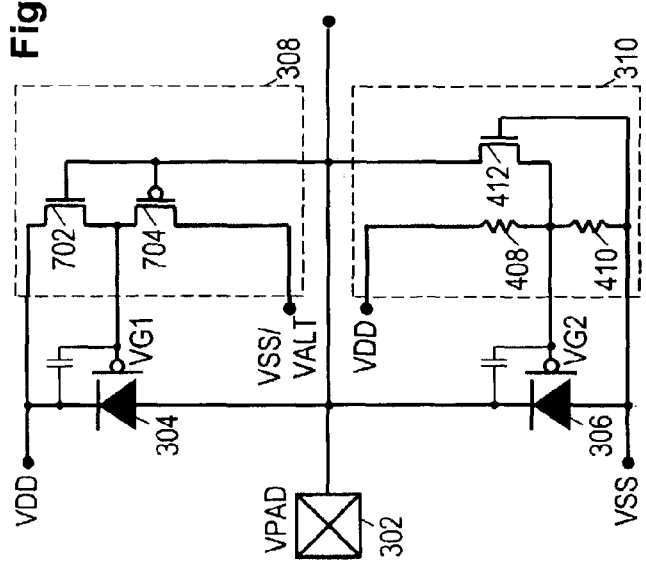
FIG. 7 shows an ESD protection circuit in accordance with a third embodiment.

FIG. 7 shows another embodiment of the upper bias circuit 308. It may include a pair of complementary transistors 702, 704, which may be MOSFETs. Transistor 702 may be coupled between the gate and the cathode of diode 304, with the transistor gate coupled to the pad voltage VPAD. Transistor 704 may be coupled between the gate of diode 304 and a voltage rail. In one contemplated embodiment, the negative voltage rail (VSS) is used. In an alternative embodiment, an intermediate supply voltage (VALT) may be used (e.g., about 1.2 volts). As before, when the circuit is unpowered, the gate voltage VG1 is zero. A positive-going ESD event causes transistor 702 to turn on, short circuiting the gate and cathode of diode 304.

When the circuit is powered, the transistors 702 and 704 bring the gate voltage VG1 to some voltage between the positive voltage rail and the supply voltage to which transistor 704 is coupled. As the pad voltage rises above the positive voltage rail, transistor 702 is on while transistor 704 is off. In this state, the circuit effectively shorts the gate of diode 304 to its cathode. As the pad voltage falls below the supply voltage to which transistor 704 is coupled, transistor 702 is off while transistor 704 is on. This configuration places the gate voltage VG1 at the supply voltage (VSS or VALT).

Figure 8:
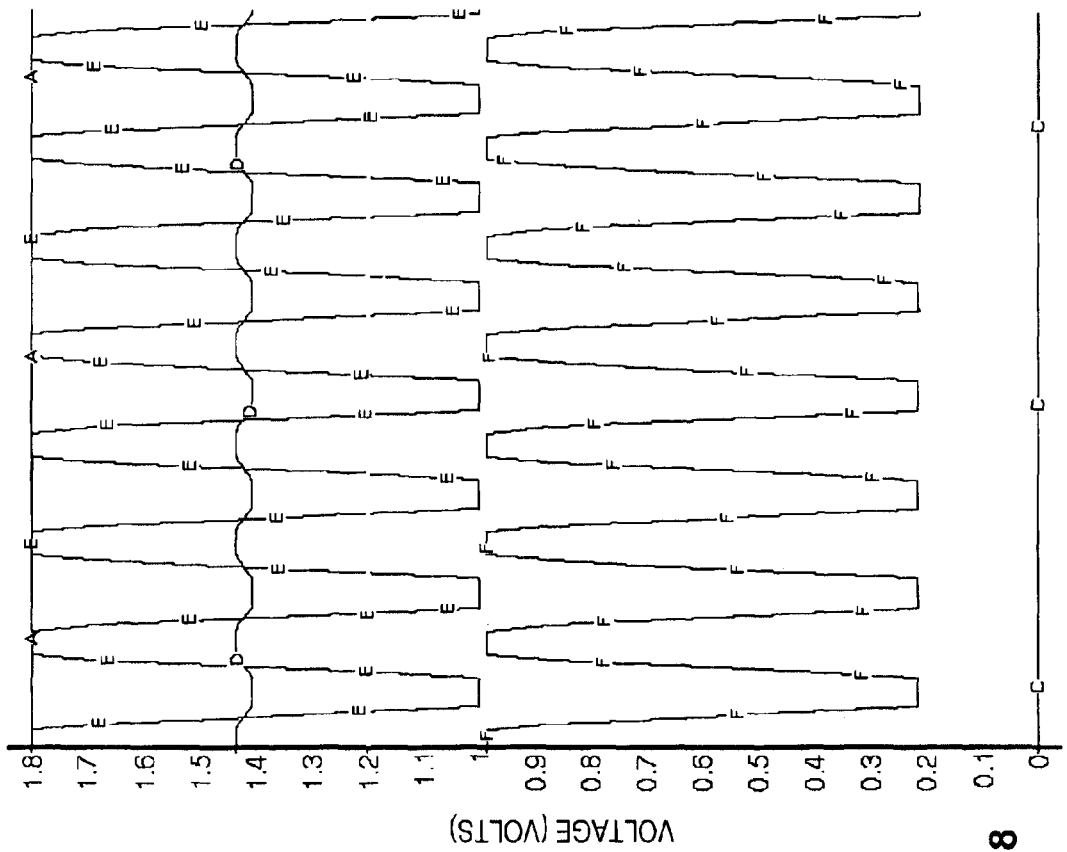
FIG. 8 shows voltage curves associated with simulations of normal operations for the third embodiment.

FIG. 8 shows a set of waveforms that result from simulated operation of the embodiment of FIG. 7 under normal operating conditions. Waveform "A" is the positive voltage rail (constant at 1.8 volts); waveform "C" is the negative voltage rail (constant at 0); and waveform "E" is an input waveform applied to the pad (VPAD). The input waveform alternates between 1.0 and 1.8 volts, with nonzero rise and fall times. Waveform "D" is the gate voltage VG1, which holds relatively steady at about 1.42 volts, but shows roughly 0.1 volts of variation. Waveform "F" is the gate voltage VG2 which averages about 0.6 volts and shows about 0.4 volts of variation in each direction. This variation is in phase with the pad voltage, and may be due to the gate-cathode capacitance of diode 306.

Figure 9:
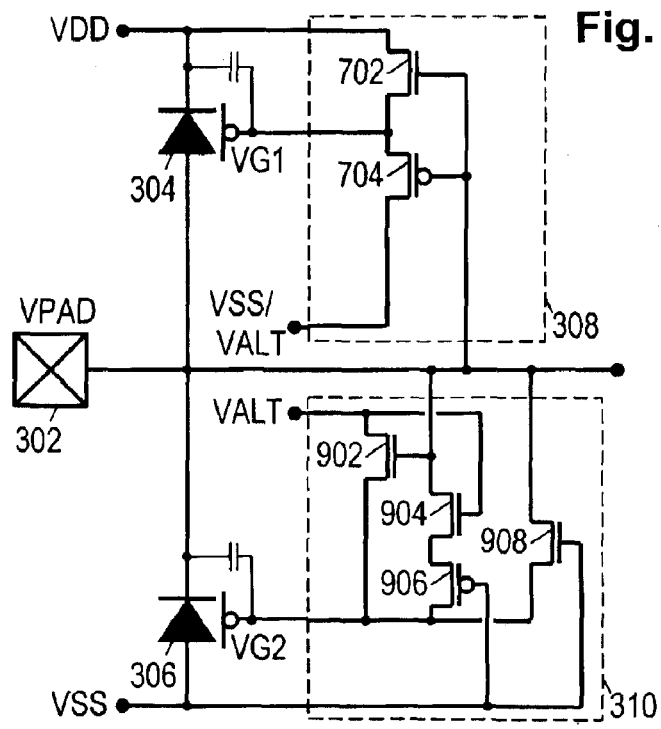
FIG. 9 shows an ESD protection circuit in accordance with a fourth embodiment.

FIG. 9 shows another embodiment of lower bias circuit 310. It may include four transistors 902, 904, 906, and 908 which may be MOSFETs. Transistor 902 may be coupled between a supply voltage VALT (which may be between the positive and negative voltage rails) and the gate of diode 306, with the transistor gate coupled to the pad voltage (VPAD). Transistor 904 may be coupled between the pad and transistor 906, with the gate of transistor 904 coupled to VALT. Transistor 906 may be coupled between transistor 904 and the gate of diode 306, with the gate of transistor 906 coupled to the negative voltage rail. Transistor 906 may be complementary to transistor 904. Transistor 908 may be coupled between the gate and cathode of diode 306, with the gate of transistor 908 coupled to the negative voltage rail.

When the pad voltage is above VALT (e.g., above 1.2 volts), transistor 902 may allow current to flow from VALT to the VG2, raising the voltage of the diode gate toward VALT, and transistor 904 may be off. When the pad voltage falls below VALT, transistor 902 may be off, and transistor 904 may turn on, allowing current flow from the diode gate towards VPAD, reducing the gate voltage VG2 toward VPAD. Transistor 906 may be on at all times during these conditions. However, when a negative ESD event is applied to VPAD, transistors 902 and 906 may be off. In this case, transistor 908 turns on and may couple VG2 to VPAD, effectively short circuiting the gate and cathode of diode 306.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a terminal configured to convey a voltage signal;
   a gated diode having an anode, a cathode, and a gate, wherein the gated diode is coupled between the terminal and a predetermined voltage node and is configured to enter a forward conduction mode during a condition, the condition being in a set consisting of electrostatic discharge (ESD) events, overvoltage conditions, and transient signal excursions; and
   a bias circuit configured to establish a low-resistance path between the cathode and gate when the gated diode is in a forward conduction mode, wherein the bias circuit is further configured to eliminate the low-resistance path when the gated diode is not in the forward conduction mode.

2. The integrated circuit of claim 1, further comprising:
   a second gated diode having a second anode, a second cathode, and a second gate, wherein the second gated diode is coupled between the terminal and a second predetermined voltage node and is configured to enter a forward conduction mode during a condition in said set; and
   a second bias circuit configured to establish a low-resistance path between the second cathode and second gate when the second gated diode is in a forward conduction mode.

3. The integrated circuit of claim 2, wherein the predetermined voltage node is a positive supply rail, and wherein the second predetermined voltage node is a negative supply rail.

4. The integrated circuit of claim 2, wherein when the gated diode is not in the forward conduction mode, the bias circuit is further configured to apply a gate voltage between the predetermined voltage node and the second predetermined voltage node.

5. The integrated circuit of claim 4, wherein when the second gated diode is not in the forward conduction mode, the second bias circuit is further configured to apply a second gate voltage between the predetermined voltage node and the second predetermined voltage node.

6. The integrated circuit of claim 4, wherein the gate voltage varies substantially in phase with the voltage signal conveyed by the terminal.

7. The integrated circuit of claim 1, wherein the bias circuit comprises:
   a first resistance between the predetermined voltage node and the gate; and
   a second resistance between the gate and a second predetermined voltage node.

8. The integrated circuit of claim 7, wherein the bias circuit further comprises:
   a transistor coupled between the cathode and the gate of the gated diode, wherein the transistor has a gate coupled to the anode of the gated diode.

9. The integrated circuit of claim 1, wherein the bias circuit comprises:
   a first transistor coupled between the cathode and the gate of the gated diode, wherein the first transistor has a gate coupled to the anode of the gated diode; and
   a second transistor complementary to the first transistor, coupled between a second predetermined voltage node and the gate of the gated diode, wherein the second transistor has a gate coupled to the anode of the gated diode.

10. The integrated circuit of claim 1, wherein the bias circuit comprises:
   a first transistor coupled in series with a second, complementary transistor between the cathode and the gate of the gated diode, wherein the gate of the first transistor is coupled to the predetermined voltage node, and wherein the gate of the second transistor is coupled to a complementary predetermined voltage node; and
   a third transistor coupled between the complementary predetermined voltage node and the gate of the gated diode, wherein the gate of the third transistor is coupled the cathode.

11. An electrostatic discharge protection method that comprises:
   configuring one or more gated diodes to shunt electrostatic discharge (ESD) events; and
   protecting gate insulators of the one or more gated diodes, wherein said protecting comprises:
      minimizing a voltage difference between a cathode and a gate of each gated diode that is operating in a forward conduction mode; and
      increasing the voltage difference between the cathode and gate of each gated diode that is not operating in the forward conduction mode to provide a respective gate voltage.

12. The method of claim 11, wherein the gate voltage is substantially at a midpoint of an expected voltage range of voltage differences between a cathode and an anode of the gated diode during normal operations.

13. The method of claim 11, wherein the gate voltage varies in phase with a voltage difference between a cathode and an anode of the gated diode.

14. The method of claim 11, wherein a range of normal-operation voltage differences between a cathode and an anode of each gated diode comprises voltage differences that exceed a limit for a voltage difference across gate insulators of the one or more gated diodes.

15. An electrostatic discharge protection circuit that comprises:
   a lower gated diode having an anode coupled to a lower supply rail, a cathode coupled to a protected node, and a gate coupled to a lower bias circuit; and
   an upper gated diode having an anode coupled to the protected node, a cathode coupled to an upper supply rail, and a gate coupled to an upper bias circuit,
   wherein the upper bias circuit is configured to provide a gate voltage substantially equal to that of the upper supply rail when a voltage of the protected node exceeds that of the upper supply rail, and wherein the upper bias circuit is further configured to provide a gate voltage significantly less than that of the upper supply rail when the voltage of the protected node is significantly below the that of the upper supply rail.

16. The circuit of claim 15, wherein when the voltage of the protected node is significantly below that of the upper supply rail, the gate voltage provided by the upper bias circuit has an average about equal to a midpoint of a range of voltage differences expected between the cathode and anode of the upper gated diode.

17. The circuit of claim 15, wherein the upper bias circuit comprises a transistor coupled between the gate and cathode of the upper gated diode, wherein the gate of the transistor is coupled to the protected node.

18. The circuit of claim 15, wherein the lower bias circuit is configured to provide a gate voltage substantially equal to the voltage of the protected node when the voltage of the protected node drops below that of the lower supply rail.

19. The circuit of claim 18, wherein the lower bias circuit is further configured to provide a gate voltage significantly less than the voltage of the protected node when the voltage of the protected node is significantly above the voltage of the lower supply rail.

20. The circuit of claim 18, wherein when the voltage of the protected node is significantly above that of the lower supply, rail, the lower bias circuit is configured to provide a gate voltage that has an average about equal to a midpoint of a range of voltage differences expected between the cathode and anode of the lower gated diode.

21. The circuit of claim 18, wherein the lower bias circuit comprises a transistor coupled between the gate and the cathode of the lower gated diode, wherein the gate of the transistor is coupled to the lower supply rail.

* * * * *